United States Patent [19]

Shankar et al.

[11] Patent Number: 4,782,380
[45] Date of Patent: Nov. 1, 1988

[54] MULTILAYER INTERCONNECTION FOR INTEGRATED CIRCUIT STRUCTURE HAVING TWO OR MORE CONDUCTIVE METAL LAYERS

[75] Inventors: Krishna Shankar, Mountain View; Ram Ramani, San Jose, both of Calif.

[73] Assignee: Advanced Micro Devices, Inc., Sunnyvale, Calif.

[21] Appl. No.: 6,000

[22] Filed: Jan. 22, 1987

[51] Int. Cl.[4] .............................................. H01L 23/48
[52] U.S. Cl. ........................................ 357/71; 357/65; 357/67; 357/68
[58] Field of Search .......................... 357/71, 65, 68, 67

[56] References Cited

U.S. PATENT DOCUMENTS

| | | | |
|---|---|---|---|
| 3,879,746 | 4/1975 | Fournier | 357/71 |
| 4,141,022 | 2/1979 | Sigg et al. | 357/71 |
| 4,361,599 | 1/1982 | Wourms | 357/71 |
| 4,609,935 | 9/1986 | Kondo | 357/71 |
| 4,659,427 | 4/1987 | Barry et al. | 357/71 R |

Primary Examiner—Martin H. Edlow
Assistant Examiner—Gregory A. Key
Attorney, Agent, or Firm—Patrick T. King; John P. Taylor

[57] ABSTRACT

Construction of a novel multilayer conductive interconnection for an integrated circuit having more than one conductive layer is disclosed comprising a lower barrier layer which may be in contact with an underlying silicon substrate and comprising a material selected from the class consisting of TiW and TiN; an intermediate layer of conductive metal such as an aluminum base metal; and an upper barrier layer which may be in contact with a second aluminum base metal layer and which is selected from the class consisting of TiW, TiN, MoSi$_x$ and TaSi where x equals 2 or more.

8 Claims, 2 Drawing Sheets

MULTILAYER INTERCONNECTION FOR INTEGRATED CIRCUIT STRUCTURE HAVING TWO OR MORE CONDUCTIVE METAL LAYERS

BACKGROUND OF THE INVENTION

1. Field of the Invention

This invention relates to an improved interconnection for integrated circuit structures and a method of making same. More particularly, this invention relates to a novel multilayer interconnection for integrated circuit structures having more than one conductive metal layer.

2. Description of the Prior Art

Conventionally, aluminum base metal, i.e., aluminum or an alloy of aluminum, is used to form the interconnections or "wiring" between components and devices in integrated circuit structures. Such uses of aluminum include the interconnections or vias used between different layers or levels of metal such as aluminum as well as for the contacts to individual elements of an active device in the integrated circuit structure such as the collector, base, and emitter contacts of a bipolar transistor or the source, drain, and gate electrodes of an MOS device.

Aluminum is not the only metal which is or can be used for such purposes. Both platinum and gold metals have also been used in such applications. However, aluminum remains by far the most prevalently used metal in integrated circuit structures because of its superior combination of low cost, low weight, and good conductivity.

However, the use of aluminum in integrated circuit structures for interconnections, contacts, and the like is not without its problems. When aluminum is used as an electrical contact to an electrode region of an active device formed in silicon, the aluminum and silicon may interdiffuse which can cause the aluminum to migrate down into the silicon substrate below the junction formed between the doped region and the substrate, e.g., below the source or drain regions, thereby shorting out the device.

Furthermore, when a layer of aluminum is used as the horizontal interconnection between devices or elements of a device, some areas of the aluminum interconnect may form hillocks or spikes upon subsequent exposure to processing temperatures above 400° C. which can, in turn, result in formation of an electrical short from the aluminum layer through an overlying insulating layer to another metal layer thereon.

The use of a conductive material such as a titanium-tungsten alloy over an aluminum layer or between two aluminum layers is known. Lin et al, in an article entitled "Linewidth Control Using Anti-Reflective Coating for Optical Purposes", IEDM International Electron Device Meeting, San Francisco, Calif., Dec. 13–15, 1982, at pp 399–402, discuss the use of various antireflective coatings such as titanium-tungsten, vanadium, and polysilicon on aluminum to lower the reflectivity of aluminum for photolithographic purposes.

Harrison et al in an article entitled "The Use of Anti-Reflective Coatings for Photoresist Linewidth Control", Kodak Microelectronics Seminar, San Diego, Calif., November, 1983 also discuss the use of antireflective coatings such as vanadium, titanium-tungsten, molybdenum, titanium, and polysilicon on aluminum-silicon materials. This latter reference also discloses the previous use of titanium-tungsten under Al-Si as a barrier layer to prevent aluminum spiking in the silicon substrate.

The use of a layer of titanium-tungsten between two aluminum layers in an integrated circuit structure as an etch stop is discussed in Pierce et al U.S. Pat. No. 4,267,012.

While the use of other materials such as titanium-tungsten between adjoining layers of aluminum is, therefore, known, it has been found that problems such as the diffusion of aluminum into an underlying silicon substrate may actually be exacerbated by the presence of materials such as an alloy of titanium-tungsten over the aluminum. Apparently this is due to the fact that a titanium-tungsten alloy and aluminum can interact to form an intermetallic compound ($Ti_xAl_yW_z$) which actually has a higher solubility for silicon than the solubility of aluminum for silicon.

It would, therefore, be desirable to provide an interconnection in integrated circuit structures having more than one conductive metal layer which would eliminate or at least mitigate some or all of the problems caused by the use of aluminum metal as the interconnection.

SUMMARY OF THE INVENTION

It is, therefore, an object of this invention to provide a highly reliable novel multilayer conductive interconnection in integrated circuit structures having more than one level of metal conductors.

It is another object of this invention to provide a novel multilayer conductive interconnection in integrated circuit structures having more than one level of metal conductors wherein the migration of aluminum from the multilayer conductive interconnection into an underlying silicon region is inhibited.

It is yet another object of this invention to provide a novel multilayer conductive interconnection in integrated circuit structures having more than one level of metal conductors wherein the formation of hillocks or spikes above the multilayer interconnection is eliminated or inhibited.

It is a further object of this invention to provide a novel multilayer conductive interconnection in integrated circuit structures having more than one level of metal conductors wherein the use of silicon in the aluminum portion of the multilayer to suppress migration may be eliminated.

It is yet a further object of this invention to provide a novel multilayer conductive interconnection in integrated circuit structures having more than one level of metal conductors wherein the cladding layers of the multilayer conductive interconnection exhibit good step coverage over the underlying materials.

It is still a further object of this invention to provide a novel multilayer conductive interconnection in integrated circuit structures having more than one level of metal conductors wherein an excellent metal 1 to metal 2 connection may be formed without sputter-etching the vias between interconnect layers depending upon the materials used in the multilayer interconnection.

These and other objects of the invention will be apparent from the following description and accompanying drawings.

In accordance with the invention, a novel multilayer conductive interconnection for an integrated circuit having more than one conductive layer comprises: a lower layer comprising a material selected from the class consisting of titanium-tungsten and titanium nitride; an intermediate layer of conductive metal such as aluminum; and an upper layer selected from the class consisting of titanium-tungsten, titanium nitride, molybdenum silicide, and tantalum silicide.

DESCRIPTION OF THE PREFERRED EMBODIMENTS

The invention provides a novel conductive interconnection for an integrated circuit structure in which more than one level of conductive metal is used to interconnect various elements and devices in the integrated circuit structure.

Figure 1:
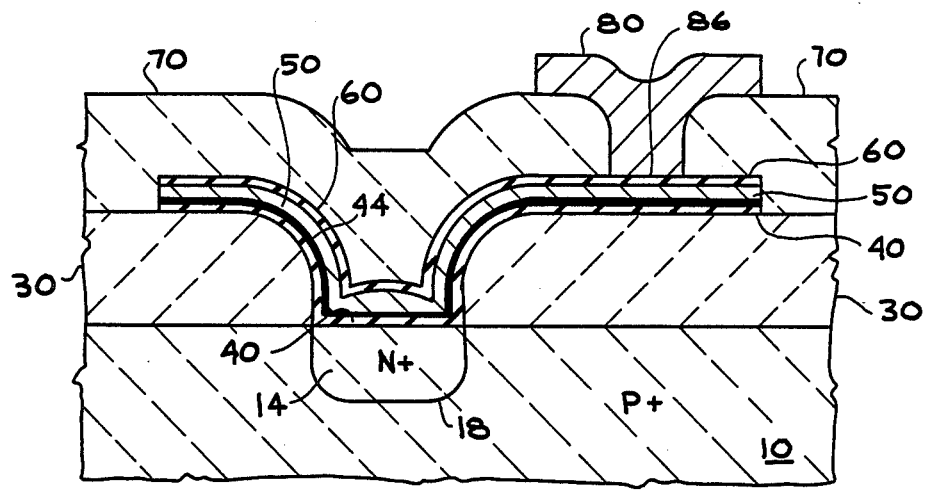
FIG. 1 is a fragmentary vertical cross-sectional view of a multilayer interconnection formed in accordance with the invention.

Turning now to FIG. 1, one embodiment of the invention is illustrated. A silicon substrate 10 of one conductivity type, for example P type, is shown having a doped region 14 of another conductivity type, for example N+, formed therein thus forming a junction 18 therebetween. Region 14 may represent an element of a transistor such as a source or drain of an MOS transistor or the emitter region of a bipolar transistor. A first oxide layer 30 is shown formed over substrate 10 on both sides of doped region 14.

In accordance with one embodiment of the invention, a first or lower barrier layer 40 is then formed over oxide layer 30 and doped region 14 as the first layer of the multilayer interconnection of the invention.

First barrier layer 40 should comprise a material exhibiting good conductivity; good adherence, both to the exposed silicon where the electrical contact will be formed, and to the surrounding oxide; and sufficiently low porosity to inhibit diffusion of either silicon or aluminum therethrough to the adjoining layer.

In a preferred embodiment, lower barrier layer 40 may comprise either a titanium-tungsten (TiW) alloy or a titanium nitride (TiN) compound. When TiW is used to form first barrier layer 40, about 800–1500 Å of TiW is deposited over the integrated circuit structure, e.g., over both doped silicon region 14 and oxide layer 30, by vacuum-sputtering from a target containing about 10–30 wt. % titanium and 70–90 wt. % tungsten in a nonreactive (inert) atmosphere of argon at a pressure of from about 5 to 15 milliTorr while maintaining a temperature of at least about 100° C. and not exceeding 400° C.

The term "nonreactive atmosphere" as used herein refers to the presence of a nonreactive gas such as argon to effect the sputtering process.

When barrier layer 40 comprises TiN, layer 40 may be formed in a two step process which comprises first sputtering a 200–800 Å layer of titanium metal in a nonreactive argon atmosphere of about 5 to 15 milliTorr and a temperature of at least about 100° C. and not exceeding 400° C. followed by a second step of reactively sputtering the titanium nitride (TiN) barrier from an elemental titanium target onto the titanium layer in a 50–60% argon/nitrogen atmosphere at a temperature of from ambient to about 200° C. Alternatively, the TiN layer formed over the titanium metal layer may be formed by sputtering TiN directly from a composite TiN target.

TiN layer 40 may also be formed in a single step by sputtering TiN directly from a composite TiN target under the same temperature and pressure conditions again using a nonreactive argon atmosphere. However, the use of a metallic titanium underlayer in the first or lower barrier layer is preferred because the titanium metal layer below the titanium compound or alloy will adhere well to both the exposed silicon where the electrical contact is to be made as well as to the adjacent oxide layer.

The use of TiW or TiN is preferred over other titanium compounds, such as, for example titanium silicide, due to the superior barrier characteristics of the TiW or TiN materials which will inhibit the migration of silicon through the barrier layer from beneath or the migration of aluminum down through the barrier layer from above.

After formation of the first or lower barrier layer, the vacuum is released or broken to expose the structure to oxygen. This exposure results in the formation of a thin oxide film 44 of about 20–50 Å over the barrier layer which will form a chemical barrier without adversely affecting the electrical contact resistance between the barrier layer and a conductive metal layer, such as an aluminum layer, which will subsequently be placed thereon. The exposure of the upper surface of the barrier layer to oxygen at this point in the process is also believed to impregnate or stuff the barrier layer with oxygen between the grain boundaries therein to further inhibit migration through the barrier layer of either the silicon from beneath or aluminum from above.

In one embodiment of the invention, after the formation of the sputtered barrier layer (TiW or TiTiN), the vacuum may be broken and the structure subjected to a rapid thermal anneal in the temperature range of 500°–650° C. for 30 seconds to 1 minute. The rapid anneal is carried out in a $N_2$ or $Ar/N_2$ atmosphere. The purpose of the anneal is to improve the electrical contact resistance of the barrier to the doped silicon regions by intimate mixing at the silicon-barrier interface and also formation of a primitive silicide ($TiSi_x$, where x is greater than (1). The anneal also improves the barrier performance by forming a nitride-rich skin such as TiWN or $TiN_x$ (where x is greater than 1) at the surface.

In another embodiment of the invention, the TiN barrier layer itself may be formed by a rapid anneal process. In this embodiment, about 500–1200 Å of titanium is first deposited by sputtering, as before, in a nonreactive argon ambient. Next the structure is subjected to a rapid thermal annealing process wherein the temperature is rapidly raised to heat the structure to about 600°–800° C., usually about 700° C., within a time period of about 10 seconds. The structure is then maintained at this temperature for a time period of about 30 seconds to 1 minute in a $N_2$ atmosphere. This rapid annealing may be carried out in special processing equipment known as a RAPID THERMAL ANNEALER which equipment has the ability to rapidly carry out $TiSi_x$ formation at the silicon level while forming a TiN barrier at the surface of the layer without oxidizing the titanium. The rapid anneal serves to form a silicide such as TiSi$_x$ (where x is greater than 1) which improves the contact resistance to N+, P+, or doped polysilicon regions. Concurrently, the unreacted titanium converts to a TiN barrier near the surface.

After the formation and oxide exposure of lower barrier layer 40, from 2500 to 4000 Å of a conductive metal layer 50 is then deposited over barrier layer 40. Conductive metal layer 50 may comprise a metal such as gold or platinum but will preferably comprise an aluminum base metal for reasons of process economics. The deposited aluminum base metal may be pure aluminum or, preferably an aluminum-copper alloy containing up to 2.0 wt. % copper. Optionally up to 2 wt. % silicon may also be present in the deposited aluminum alloy.

The use of the term "aluminum base metal" as used herein, is intended to define pure aluminum as well as aluminum alloys containing at least about 90 wt. % aluminum.

The aluminum base metal is preferably applied by sputtering in an argon atmosphere while maintaining a pressure of from about 5 to 15 milliTorr and a temperature of 300° C.

After depositing the aluminum base metal and without breaking the vacuum to avoid formation of any undesirable aluminum oxide film on the surface of the newly deposited aluminum base metal, an upper barrier layer 60 is formed.

Upper barrier layer 60 comprises from about 800 to 1200 Å of a material selected from the class consisting of TiW, molybdenum silicide (MoSi$_x$), tantalum silicide (TaSi$_x$), or TiN where x equals 2 or more. The first three specified materials are particularly preferred because the use of any of these materials to form upper barrier layer 60 will result in elimination of the need to sputter etch the surface of the first multilayer interconnection prior to deposition of the second metal layer.

It should be further noted that both the molybdenum and tantalum silicides may either comprise metal silicide compounds or merely amorphous mixtures of the metal and silicon wherein x=2 or more and the use of the respective terms molybdenum silicide and tantalum silicide herein are intended to embrace both the compounds and the amorphous mixtures.

The use of sputter etching techniques to conventionally clean the surface of the first aluminum layer in the prior art before applying the second aluminum layer are known to deleteriously affect the integrity of thin oxide dielectrics used in MOS processes. When such structures are present, it is desirable to avoid risking damage thereto by sputter etching. Practice of this invention permits one to optionally avoid the sputter etching step by using TiW, MoSi$_x$, or TaSi$_x$ as upper barrier layer 60.

When TiN is used as the upper barrier layer, however, sputter etching must be subsequently used to remove undesired oxide films from the upper surface to provide a good electrical contact with subsequently applied metal layers.

Any of the upper barrier layer 60 choices may be deposited sequentially by sputtering without breaking vacuum using the same techniques used in forming lower barrier layer 40. When the silicides (MoSi$_x$ or TaSi$_x$) are used to form upper barrier layer 60, they may be formed by sputtering them either from composite silicide targets or by cosputtering molybdenum/tantalum and silicon from separate targets.

After formation of upper barrier layer 60, the formation of the multilayer lower metal layer, comprising lower barrier layer 40, aluminum base metal layer 50, and upper barrier layer 60, is complete and will hereinafter be referred to collectively as the interconnection layer and will function in the integrated circuit structure in place of what is normally referred to as the first metal layer.

The interconnection layer may now be patterned to form the desired interconnects or wiring harness by applying a photoresist mask, and then patterning the mask using conventional photolithography techniques.

The interconnection layer is then etched through the photoresist mask using conventional plasma/reactive ion etch chemistry such as CHCl$_3$, Cl$_2$, SiCl$_4$, and CF$_4$ gas-mixtures to etch through the composite sandwich-metal sequentially.

After patterning of the interconnection layer of the invention, the structure may be subjected to conventional processing to form a second oxide layer which will serve to separate the patterned portions of the interconnection layer of the invention from a subsequently applied metal layer which is usually referred to as the second metal layer.

A second oxide layer 70 is, therefore, conventionally formed and patterned, as shown in FIG. 1, and a second metal layer 80, e.g., an aluminum base metal layer, is then applied and patterned. As shown in FIG. 1, second metal layer 80 forms a junction with the upper layer 60 of the interconnection at 86. Second metal layer 80 may also comprise either pure aluminum or, preferably an aluminum-copper alloy containing up to 0.5 wt. % copper. Optionally up to 2 wt. % silicon may also be present in the deposited aluminum base metal comprising metal layer 80.

To provide a good connection between second metal layer 80 and the upper surface of upper barrier layer 60 at 86, it is necessary that the exposed portion of the upper surface of layer 60 be cleaned to remove oxides which would provide an undesirably high contact resistance at the junction 86 between the interconnection layer and the second metal layer.

When upper barrier layer 60 comprises MoSi$_x$ or TaSi$_x$, the surface may be cleaned by dipping the structure briefly into a wet etchant such as a 40:1 buffered HF to remove SiO$_2$ grown on the silicide. When TiW is used to form upper barrier layer 60, a fluorine chemistry-based plasma etch is used such as CF$_4$/O$_2$ or CHF$_3$/O$_2$ or SF$_6$/He to remove the TiW oxide. This will be a low power process using about 50-200 watts at a pressure of about 100-200 millitorr for 30 seconds to 1 minute. As previously discussed, the use of TiN in the formation of upper barrier layer 60 may necessitate the use of a conventional sputter etch to clean the surface prior to deposition of second metal layer 80 thereon.

It perhaps should be noted in this regard that in the construction of the interconnection layer, formation of aluminum layer 50 over lower barrier layer 40 may proceed without such a cleaning step even though lower barrier layer 40 has been exposed to air because the thickness of the oxide layer formed over lower barrier layer 40 of about 20-50 Å can be penetrated by the subsequently applied aluminum layer 50. However, the formation of upper oxide layer 70 will result in the exposure of the upper surface of upper barrier layer 60 to temperatures at which there will be sufficient growth of oxide to render such a cleaning step necessary to provide the desired low resistance contact at 86.

Figure 2:
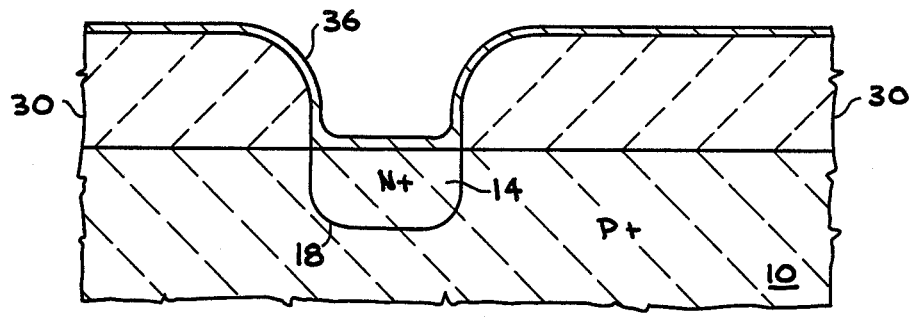
FIG. 2 is a fragmentary vertical cross-sectional view of a preliminary construction step of another embodiment of a multilayer interconnection formed in accordance with the invention.
Figure 3:
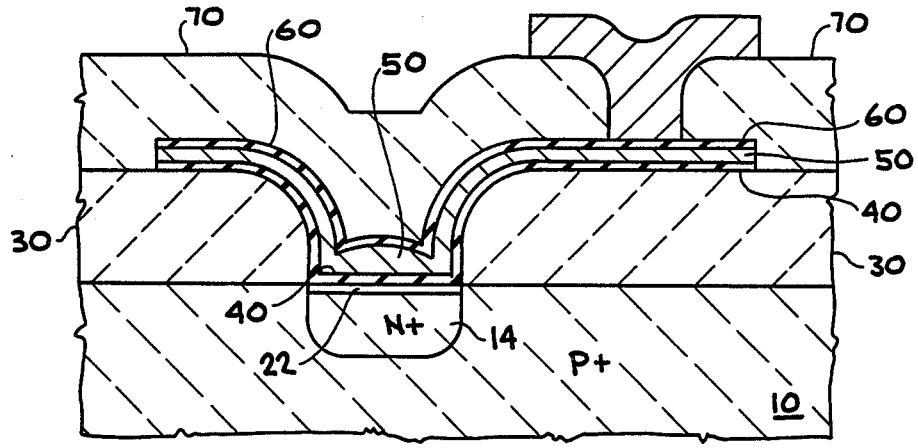
FIG. 3 is a fragmentary vertical cross-sectional view of the embodiment of FIG. 2 after completion of the multilayer interconnection.
Figure 4:
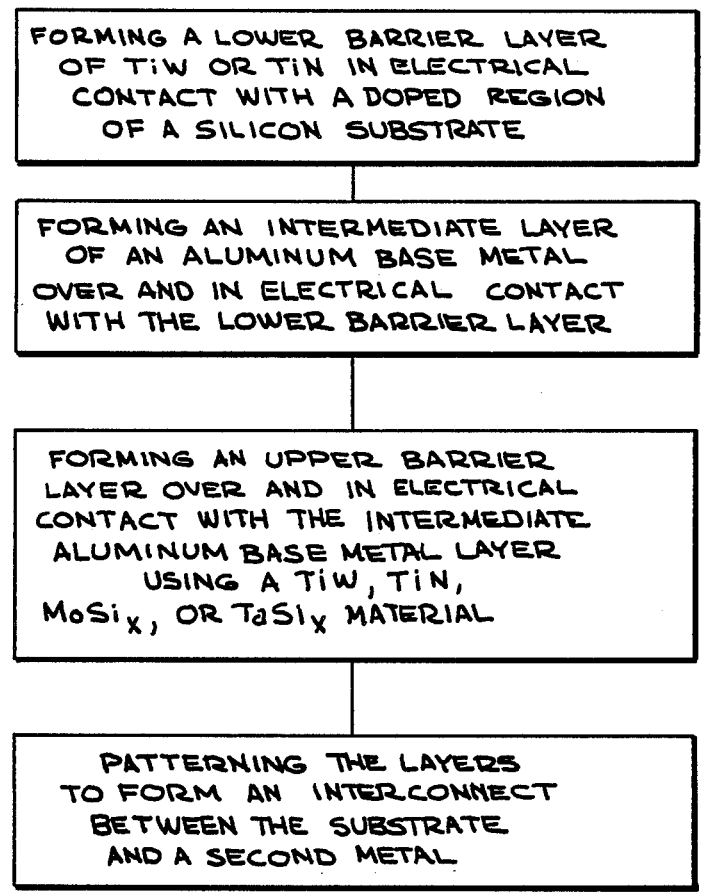
FIG. 4 is a flow sheet illustrating the process of the invention.

Turning now to FIGS. 2 and 3, another embodiment of the invention is shown representing a variation of the basic process wherein a self-aligned metal silicide contact is formed over doped region 14 in silicon substrate 10 using oxide 30 as a mask prior to formation of first barrier layer 40 of the interconnection layer to achieve better contact between the interconnection layer and the silicon substrate.

As shown in FIG. 2, a layer 36 of a metal capable of reacting with silicon to form a metal silicide is applied over doped region 14 and oxide layer 30. Metal layer 36 may be formed by sputtering a 150–400 Å layer of a metal such as platinum or titanium over the surface. The structure is then annealed at a temperature of about 500°–700° C. for up to about 30 minutes in a nonreactive atmosphere free of any oxygen such as an argon or nitrogen atmosphere to sinter the metal and form metal silicide wherever the metal is in contact with silicon. The result, as shown in FIG. 3, is a self-aligned metal silicide layer 22, such as $TiSi_2$ or PtSi, formed selectively only in the doped silicon contact region 14 in silicon substrate 10.

Alternatively, the structure may be subjected to the previously described rapid annealing process for a period of up to about 2 minutes at a temperature of about 700° C. to form the metal silicide.

In either process, the unreacted metal is then removed using an etchant selective to the unreacted metal such as an aqua regia etch for platinum or an ammonium hydroxide/peroxide etch for titanium. After removal of the unreacted metal from the structure, formation of lower barrier layer 40 of the interconnection layer may proceed as previously described resulting in the structure shown in FIG. 3.

The result, in the practice of either embodiment of the invention, is an improved, more reliable, integrated circuit structure having an interconnection layer wherein diffusion of either aluminum of silicon is prevented or inhibited and the formation of aluminum spikes and hillocks is also prevented or inhibited. Due to the presence of the lower and upper barriers, the electromigration resistance of the metal 1 interconnect increase, thus rendering the integrated circuit more reliable. The interconnect layer of the invention also serves as an antireflective layer permitting enhanced photolithography in the printing of fine lines. The electrical connection between the interconnect layer and the metal 2 layer is enhanced without the necessity of sputter etching, if desired, resulting in a structure with excellent reliability.

Having thus described the invention, what is claimed is:

1. An improved integrated circuit structure comprising a novel multilayer conductive interconnection layer formed between the substrate and a second metal layer, and characterized by reduced diffusion of conductive metal and silicon therebetween and reduced formation of spikes or hillocks, said structure comprising:
   (a) a silicon substrate having at least one doped region and oxide portions adjacent said doped region;
   (b) a lower conductive barrier layer in electrical contact with said doped region of said substrate comprising a material selected from the class consisting of TiW and TiN;
   (c) an intermediate layer of conductive metal comprising a 2500–3500 Å layer of an aluminum base metal formed over and in contact with said lower conductive layer;
   (d) an upper conductive barrier layer formed on said intermediate layer and selected from the class consisting of TiW, TiN, $MoSi_x$, and $TaSi_x$ wherein x equals 2 or more; said lower layer, intermediate layer, and upper layer functioning together as a multilayer interconnection layer; and
   (e) a second metal layer in said structure having at least one portion thereof in electrical contact with said interconnection layer.

2. The structure of claim 1 wherein said lower conductive barrier layer comprises a 800–1500 Å layer to inhibit the diffusion of silicon therethrough into said intermediate aluminum base metal layer and the diffusion of aluminum from said intermediate layer therethrough into said silicon substrate.

3. The structure of claim 2 wherein said lower conductive barrier layer is further characterized by a 20–50 Å layer of oxide on the upper surface thereof.

4. The structure of claim 3 wherein said lower barrier layer is further characterized by oxide present between the grain boundaries therein formed by exposing said layer to the atmosphere after the formation thereof and prior to forming said intermediate layer thereon.

5. The structure of claim 2 wherein said upper conductive barrier layer comprises a 800–1200 Å layer which will inhibit the diffusion of aluminum therethrough from said intermediate layer to form hillocks or spikes passing into other layers thereover.

6. The structure of claim 5 wherein said substrate further comprises a doped silicon region having a metal silicide layer formed in the surface thereof beneath said lower conductive barrier layer to enhance the conductivity between said doped region in said substrate and said interconnection layer.

7. An improved integrated circuit structure comprising a novel multilayer conductive interconnection layer formed between the substrate and a second metal layer, and characterized by reduced diffusion of conductive metal and silicon therebetween and reduced formation of spikes or hillocks, said structure comprising:
   (a) a silicon substrate having at least one doped region and oxide portions adjacent said doped region;
   (b) a lower conductive barrier layer in electrical contact with said doped region of said substrate comprising a material selected from the class consisting of TiW and TiN;
   (c) a 2500–3500 Å intermediate layer of conductive metal formed over and in contact with said lower conductive layer;
   (d) an upper conductive barrier layer formed on said intermediate layer and selected from the class consisting of TiW, TiN, $MoSi_x$, and $TaSi_x$ wherein x equals 2 or more; said lower layer, intermediate layer, and upper layer functioning together as a multilayer interconnection layer; and
   (e) a second metal layer in said structure having at least one portion thereof in electrical contact with said interconnection layer.

8. The improved integrated circuit structure of claim 7 wherein said intermediate layer of conductive metal is selected from the class consisting of gold, platinum, and an aluminum base metal.

* * * * *